United States Patent
Mokhlesi et al.

(10) Patent No.: US 6,856,551 B2
(45) Date of Patent: Feb. 15, 2005

(54) SYSTEM AND METHOD FOR PROGRAMMING CELLS IN NON-VOLATILE INTEGRATED MEMORY DEVICES

(75) Inventors: Nima Mokhlesi, Los Gatos, CA (US); John H. Pasternak, Santa Clara, CA (US)

(73) Assignee: SanDisk Corporation, Sunnyvale, CA (US)

( * ) Notice: Subject to any disclaimer, the term of this patent is extended or adjusted under 35 U.S.C. 154(b) by 0 days.

(21) Appl. No.: 10/359,993

(22) Filed: Feb. 6, 2003

(65) Prior Publication Data

US 2004/0156241 A1 Aug. 12, 2004

(51) Int. Cl.$^7$ ............................................. G11C 11/34
(52) U.S. Cl. .............................. 365/185.28; 365/185.19
(58) Field of Search .......................... 365/185.19, 185.28

(56) References Cited

U.S. PATENT DOCUMENTS

| | | | | |
|---|---|---|---|---|
| 5,469,384 A | * | 11/1995 | Lacey | ................... 365/185.13 |
| 5,537,350 A | | 7/1996 | Larsen et al. | .......... 365/185.33 |
| 5,553,020 A | | 9/1996 | Keeney et al. | ......... 365/185.19 |
| 5,870,335 A | | 2/1999 | Khan et al. | ............ 365/185.18 |
| 5,946,236 A | | 8/1999 | Kajitani | ................. 365/185.19 |
| 6,028,790 A | | 2/2000 | Lin et al. | ............... 365/185.18 |
| 6,038,174 A | | 3/2000 | Khan et al. | ............ 365/185.28 |
| 6,219,279 B1 | | 4/2001 | Manolescu et al. | .... 365/185.21 |
| 6,285,598 B1 | | 9/2001 | Khan et al. | ............ 365/185.28 |

FOREIGN PATENT DOCUMENTS

| | | |
|---|---|---|
| EP | 0 373 830 A2 | 6/1990 |
| EP | 0764953 | 3/1997 |
| EP | 1018747 | 7/2000 |
| EP | 1246196 | 10/2002 |

OTHER PUBLICATIONS

International Search Report mailed Aug. 6, 2004.

* cited by examiner

*Primary Examiner*—M. Tran
(74) *Attorney, Agent, or Firm*—Parsons Hsue & de Runtz LLP (57) ABSTRACT

A system and method for quickly and efficiently programming hard-to-program storage elements in non-volatile integrated memory devices is presented. A number of storage elements are simultaneously subjected to a programming process with the current flowing through the storage elements limited to a first level. As a portion of these storage elements reach a prescribed state, they are removed from the set of cells being programmed and the current limit on the elements that continue to be programmed is raised. The current level in these hard-to-program cells can be raised to a second, higher limit or unregulated.

23 Claims, 6 Drawing Sheets

SYSTEM AND METHOD FOR PROGRAMMING CELLS IN NON-VOLATILE INTEGRATED MEMORY DEVICES

TECHNICAL FIELD

The present invention relates generally to non-volatile integrated memory devices and, more particularly, to a system and method for controlling current levels during the programming of non-volatile integrated memory devices.

BACKGROUND

In many non-volatile computer memories, the ability to store data is often related to the amount of current that flows through a particular storage unit during the programming process. One particular example of a non-volatile memory is a Flash or EEPROM memory where the state of a storage unit within the memory is dependent on the amount of charge stored on a floating gate. In general terms, the greater the current that flows through a given unit, the quicker it can be programmed, the wider range of levels to which it can be programmed, or both. However, as a large number of storage units are generally programmed in parallel, with the trend being towards even greater numbers, this results in high current levels, both on average and instantaneously, that are at odds with the trend to lower power devices.

Non-volatile data storage devices, such as electronically erasable programmable read-only memories (EEPROM) or flash memories, are widely used in portable devices lacking a mass data storage devices and a fixed source of power, such as cellular phones, handheld personal computers (PCs), portable music players and digital cameras.

Flash memories are typically semiconductor field effect transistor devices having a number of storage elements each one or more isolated floating gates programmed to store information by injecting charge on the floating gate to change a threshold voltage of the transistor. The injected charge changes the threshold voltage from an intrinsic threshold voltage by an amount proportional to the amount of stored charge. The new threshold voltage of the transistor represents one or more bits of programmed data or information. For example, in a simple memory cell storing a single bit of data, the threshold voltage of the transistor is either raised to a value near a high end of the threshold voltage space or maintained at a value near a low end. These two programmed threshold voltages represent a logical one or a logical zero, and program the memory cell to either turn on or not, respectively, when read conditions are established, thereby enabling a read operation to determine if data stored in the memory cell is a logical one or a logical zero.

Non-volatile memories in general, and Flash EEPROM devices in particular, are discussed more fully in a number of patents and patent applications for various architectures and cell structures. A NOR array of one design has its memory cells connected between adjacent bit (column) lines and control gates connected to word (row) lines. The individual cells contain either one floating gate transistor, with or without a select transistor formed in series with it, or two floating gate transistors separated by a single select transistor. Examples of such arrays and their use in storage systems are given in the following U.S. patents and pending applications of SanDisk Corporation that are incorporated herein in their entirety by this reference: U.S. Pat. Nos. 5,095,344, 5,172,338, 5,602,987, 5,663,901, 5,430,859, 5,657,332, 5,712,180, 5,890,192, and 6,151,248, and Ser. No. 09/505,555, filed Feb. 17, 2000, and Ser. No. 09/667,344, filed Sep. 22, 2000.

A NAND array of one design has a number of memory cells, such as 8, 16 or even 32, connected in series string between a bit line and a reference potential through select transistors at either end. Word lines are connected with control gates of cells in different series strings. Relevant examples of such arrays and their operation are given in the following U.S. patent application Ser. No. 09/893,277, filed Jun. 27, 2001, that is also hereby incorporated by reference, and references contained therein.

EEPROM programming mechanisms include drain side Channel Hot Electron Injection, in which a high voltage on the control gate and another high voltage on the drain cause hot electrons to cross from the drain side of the channel to the floating gate through a thin oxide layer, and Source Side Injection. For Source Side Injection, the presence of a select gate or side-wall can be used to create a select transistor in series with the floating gate transistor. In Source Side Injection a voltage, slightly greater than the threshold voltage of the select transistor is placed on the select gate, a high voltage is capacitively coupled to the floating gate by applying a high voltage to the control gate, and a high voltage is applied to the drain of the floating gate transistor. The voltage on the select gate is sufficient to turn on a portion of the channel under the select gate. The differential voltage between the source and drain generates channel hot electrons at the gap between the select gate and the floating gate which are then swept to the floating gate by a favorable electric field in the gap oxide near the source side of the floating gate.

The latest generation of flash memories can have arrays of hundreds of millions of memory cells which are programmed and erased in sectors or programming blocks ranging in size from 128 to 64K bytes, where the erase and the programming blocks are often not the same size. The programming of large numbers of memory cells is described, for example, in a U.S. patent application entitled "Pipelined Parallel Programming Operation in a Non-Volatile Memory System" by Kevin M. Conley and Yoram Cedar, filed Feb. 22, 2002, that is also hereby incorporated by reference, and references contained therein. Power consumed in programming the large number of memory cells in a sector has become a significant problem in conventional flash memories. It is particularly a problem for portable devices that rely on batteries and generally have an on-chip voltage supply or charge pump with a limited power capacity. Moreover, the trend in many portable devices, such as cellular phones and digital cameras, has been towards smaller devices or form factors. Thus, the increasing number memory cells and the shrinking battery sizes in portable devices have introduced further limitations on the ability to program large numbers memory cells in parallel.

The present invention provides a solution to these and other problems, and offers other advantages over the prior art.

SUMMARY

It is an object of the present invention to provide a system and method for quickly and efficiently programming hard-to-program storage elements in non-volatile integrated memory devices. According to a principle aspect of the present invention, a number of storage elements are simultaneously subjected to a programming process with the current flowing through the storage elements limited to a first level. As a portion of these storage elements reach a prescribed state, they are removed from the set of cells being programmed and the current limit on the elements that continue to be programmed is raised. Although this results in the amount of current flowing per element increasing, since the number elements in which it flows is decreased, the cumulative current flowing can be maintained at a low level while still applying greater current to hard-to-program storage elements.

In an embodiment employing a Flash EEPROM memory, a circuit is provided for quickly and efficiently programming memory cells in a programmable memory device that reduces the instantaneous and average programming current with little or no reduction in programming speed. In general, the method involves applying a set of voltage waveforms to the various gates, and drains of the memory cells that are targeted for programming while limiting drain to source current ($I_{DS}$) through each of the selected memory cells to a predetermined level by raising the source voltage (source de-biasing) and applying at least one programming pulse to the memory cells. For the cells that need further programming, the $I_{DS}$ limited is raised and further programming pulses are applied.

In one set of embodiments, the present invention is applied in a coarse-to-fine programming technique. In general, the method involves the steps of simultaneously verifying all cells that belong to a programming block against their individual coarse target thresholds and locking out those cells whose thresholds have already exceeded their respective coarse programming thresholds and applying a programming pulse to those cells which have not reached their coarse programming threshold. This process is repeated, but with each repeated programming step increasing the control gate (steering gate) programming voltage pulse by a predetermined coarse increment value. This can continue until all cells in the programming block have been programmed to their respective coarse thresholds, or until the predetermined maximum number of coarse pulses is reached.

In one embodiment, if some predetermined number of coarse pulses have been exhausted and there still remain some cells which have not been programmed to their respective coarse targets, then the source de-biasing condition can be relaxed or lifted at this point, and the program-verify process can be repeated until all cells have reached their coarse targets, or until another predetermined maximum number of allowed coarse pulses have been reached.

At this point, the fine programming phase begins by simultaneously verifying all cells that belong to a programming block against their individual fine programming target thresholds. Those cells whose thresholds have already exceeded their respective fine programming thresholds are locked out and a programming pulse is applied to those cells which have not reached their fine programming thresholds. (The first fine programming pulse applied to each cell's control gate can be smaller by some predetermined amount referred to as the coarse-to-fine-step-back-voltage from the last coarse programming voltage pulse applied to that cell.) The verify-program steps are repeated, but with each repeated programming step increasing the programming pulse by a predetermined fine increment value, until all cells in the programming block have been programmed to their respective fine thresholds, or until the predetermined maximum number of fine pulses is reached. If the maximum number of fine pulses have been exhausted and there still remain some cells which have not been programmed to their respective fine targets, then the source de-biasing condition can again be relaxed or lifted at this point, and the program-verify process repeated until all cells have reached their fine targets, or until another predetermined maximum number of allowed non-de-biased fine pulses have been exceeded.

Preferably, the method includes the further step of turning off memory cells that have been programmed prior to the step of providing a higher $I_{DS}$ to each insufficiently-programmed memory cell.

In one embodiment, the step of limiting $I_{DS}$ is accomplished using a current limiter, and the step of providing a higher $I_{DS}$ to each storage unit in each under-programmed memory cell involves overriding the current limiter. Alternatively, the current limiter is capable of limiting $I_{DS}$ to one of a number of predetermined levels, and the step of providing a higher $I_{DS}$ to each FET in each insufficiently-programmed memory cell includes the step of limiting $I_{DS}$ through each FET in each insufficiently-programmed memory cell to a higher one of the predetermined levels.

In another embodiment, an intelligently determined number of programming pulses up to a predetermined maximum number is applied to each cell in the programming block while the current through the storage unit is limited by the current limiter. Subsequently, a second intelligently determined number of programming pulses up to another predetermined maximum number is applied to each hard to program cell in the programming block to which the higher current needs to be provided. In yet another embodiment, programming pulses are applied to each selected memory cells until a predetermined number of memory cells have been programmed. Thereafter, a number of programming pulses are applied to remaining hard-to-program memory cells to which the higher $I_{DS}$ is provided. Alternatively, programming pulses can be applied to each memory cell to which the higher current is provided until at least a second predetermined number of memory cells have been programmed leaving a last few number of very-hard-to-program cells that are not totally programmed to their final target threshold voltages. Error correction code can be relied upon to correct the errors produced by the possible existence of these last few cells.

The method and circuit of the present invention are particularly useful in a non-volatile memory device having a number of non-volatile storage units. In general, the circuit includes: (i) a voltage supply capable of applying a voltage differential across a pair of terminals in selected storage units; (ii) a current limiter capable of limiting current ($I_{DS}$) through each selected storage units to a predetermined level; (iii) a programming sub-circuit capable of applying programming pulses to the selected storage units; and (iv) a set of peripheral circuits internal to the memory chip capable of controlling the current limiter to allow a higher current level to each hard-to-program storage units after at least a predetermined number of programming pulses have been applied to the selected storage units. In one embodiment, the internal memory chip's peripheral circuits are configured to provide a higher current to each hard-to-program storage unit by overriding the current limiter. Alternatively, the current limiter is capable of limiting current to one of a number of predetermined levels, and the internal memory chip's peripheral circuits are configured to control the current limiter to provide a current at a higher one of the number of predetermined levels to each hard-to-program memory cell after a predetermined number of programming pulse have been applied to the selected memory cells.

In another embodiment, the internal memory chip's peripheral circuits are configured to control the current limiter to provide the higher current to each hard-to-program memory cell after a predetermined number of programming pulses have been applied to the selected memory cells.

In yet another embodiment, the internal memory chip's peripheral circuits are configured to control the current limiter to provide the higher current to each hard-to-program memory cell after a predetermined number of the selected memory cells have been programmed. In a further embodiment, the various aspect of the invention can be applied to a soft programming process, which is other wise known as erase recovery. There may exist defective memory cells that have already been mapped out of the logical sector and are hard to soft program under source debasing conditions. These memory cells may be soft programmed with a grounded source, so as to eliminate parasitic current paths that introduce read errors when a deselected over erased memory cell (that is intended to be off) actually conducts.

Additional aspects, features and advantages of the present invention are included in the following description of exemplary embodiments, which description should be read in conjunction with the accompanying drawings.

BRIEF DESCRIPTION OF THE DRAWINGS

These and various other features and advantages of the present invention will be apparent upon reading of the following detailed description in conjunction with the accompanying drawings, where.

DETAILED DESCRIPTION

Figure 1:
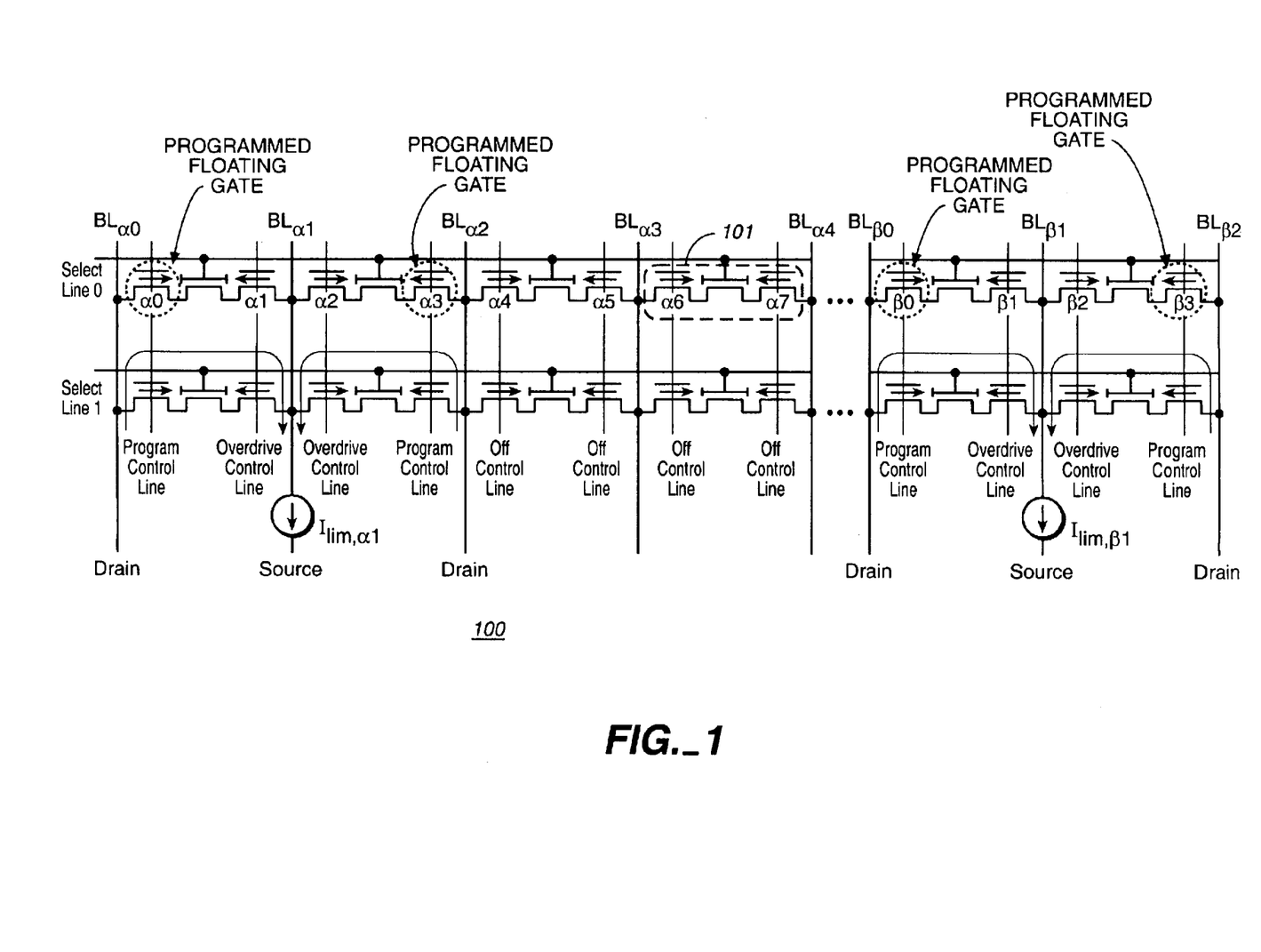
FIG. 1 is an exemplary embodiment of a memory array in which the present invention is employed.

FIG. 1 shows an exemplary embodiment of a portion of a non-volatile memory array 100. In this particular embodiment, each storage unit is a dual floating gate EEPROM unit that is programmed by source side injection. For example, an individual storage unit 101 has floating gate transistors $\alpha_6$ and $\alpha_7$ on either side of a select gate transistor connected between bit lines $BL_{\alpha 3}$ and $BL_{\alpha 4}$ in a virtual ground arrangement. Two rows, connected to Select Lines 0 and 1, and two blocks, the $\alpha$ and $\beta$ areas, of array 100 are shown in FIG. 1, with the actual array generally being much larger. The individual floating gate transistors can each store two or more data states.

The various aspects of the present invention are not particular to the specific type of array shown in FIG. 1, but this structure will often be used as an exemplary embodiment since it can readily illustrate many of the aspects of the present invention. As described in the Background section, current non-volatile memory systems often program extremely large numbers of storage unit in parallel. For example, massively parallel programming is the U.S. patent application entitled "Pipelined Parallel Programming Operation in a Non-Volatile Memory System" by Kevin M. Conley and Yoram Cedar, filed Feb. 22, 2002, which is hereby incorporate by reference, and references contained therein. How quickly and to what level each of these storage units can be programmed, their "programmability", is dependent on the amount of current flowing through the channel of the transistor during the programming process, as is described below. To control the total cummulative current, both on average and at peak levels, a current limiting device can be placed on the source lines of the cell being programmed. This is shown in FIG. 1 where current limiter 103 sets a maximum current level of $I_{\alpha 1, lim}$ for transistor $\alpha_0$, transistor $\alpha_3$, or both, and current limiter 105 sets a maximum current level of $I_{\beta 1, lim}$ for transistor $\beta_0$, transistor $\beta_3$, or both, with the other cells being programmed (and not shown in the figure) being similarly limited.

One way to achieve this is by source de-biasing, which serves to limit the drain to source programming current by raising the source voltage. This will increase the threshold voltage of all transistors (including those storing data) that are in series between the source and the corresponding drain through the body effect and will also reduce the drain to source voltage, thereby reducing the programming current. Previously source de-biasing was envisioned to be either on or off. While an improvement over earlier designs, this approach is not wholly satisfactory.

One disadvantage is that within each sector there typically exists a minority of memory cells that require a higher programming current or longer time to program. The root causes of the existence of such hard-to-program memory cells can be many and include, but are not limited to, the following: 1) cell to cell variations affecting the cell capacitive coupling ratios, 2) the drain/source junction properties, 3) variations in cell oxide thicknesses. 4) asperities in the various material interfaces, 5) microscopic defects/broken bonds in the oxides, the channels, and the junctions of the cell transistors. Thus, in order to provide an acceptably large memory and acceptably short programming time, it is desirable that these cells be programmed at a higher voltage. However, previously source de-biasing was set in the factory and would remain engaged for the life of the chip.

In one embodiment, source de-biasing is achieved by taking the drain to source current out of the source using a constant current sink. An ideal constant current sink (source) instantaneously adapts to a time varying load and applies varying voltages to the source (confined to a limited range) in order to maintain a constant current. In an n-type transistor de-biasing refers to applying a positive voltage to the source. This positive voltage changes even during a single programming pulse. Therefore, in this embodiment, de-biasing is not constant in the sense that the voltage level of de-biasing is dynamically controlled by a constant current source. However, in the same embodiment, the current level of de-biasing is fixed, so in this sense de-biasing can be referred to as being constant.

In the above described source de-biasing method, this option would be set either on or off in the factory and would remain constant with $I_{\alpha 1, lim} = I_{\beta 1, lim} = I_{\gamma 1, lim} = \ldots = I_{lim}$ for the entire chip for the life of the chip. The new innovation consists of dynamically turning off source de-biasing toward the end of each sector's programming by independently varying the various $I_{\cdot, lim}$s ($I_{\alpha 1, lim}, I_{\beta 1, lim}, \ldots$) when a few persistent cells remain to be programmed/soft programmed. Since grounded source programming will be resorted to only when a small fraction of cells remain to be programmed, the excess current per cell will not cause excessive chip current consumption because only a few cells will be drawing current. As an example, if grounded source programming results in a 10 fold increase in programming current, then up to 10% of the cells in each programming unit, or "chunk", can simultaneously be programmed with the source grounded, when the other 90% of the cells have been locked out.

Although the present invention is not limited to the array and storage unit structure shown in FIG. 1, this structure is useful as an exemplary embodiment as it contains many features found in other EEPROM and flash systems. FIG. 1 shows a virtual ground array of multi-state storage units each with multiple floating gates; as such, each storage unit bears a number of similarities to a small NAND array, with the storage units themselves arranged in a NOR type architecture. More generally, the memory may employ any of the various NAND or NOR architectures described in the various references incorporated by reference above. By ignoring one of the floating gate transistors in each storage unit (such as $\alpha_6$ in 101), the storage units are reduced to a more traditional floating gate transistor with a select gate. The discussion also readily extends to the case where the select gate is lacking or replaced by side-wall structure, where architectures other than a virtual ground array is used, and where the storage unit is programmed by techniques other than source side injection. The storage unit may also be a NAND string, comprising a number of floating gate transistors connected in series with a select transistor at either end. Even the dual floating gate structure of the exemplary embodiment may have a number of variations, for example erase of the floating gates could be through the channel. As used here, in floating gate embodiments the term "storage unit" will refer to a series of one or more floating gate transistors and possibly one or more select gate transistors. Further details on these different structures are given in the references cited in the Background section. Various issues related to both source side injection and virtual ground arrays are described in U.S. patent application Ser. No. 09/865,320 filed on May 25, 2001, which are hereby incorporated by reference, and references cited therein.

As various aspects of the present invention are related to programming a large number of storage units in parallel where the programmability of the storage units depends on the current flowing through the individual storage units, they are also applicable to parallel programming in other forms of storage units whose programmability depends on current flow. Further, the limiting of current in a read process is described in U.S. patent application Ser. No. 10/254,830, filed Sep. 24, 2002, which is hereby incorporated by reference. Although "storage unit" and "array" can refer to any of these structures in the following, the operation of FIG. 1 will briefly be described in more detail as it will often be referred to.

Figure 2A:
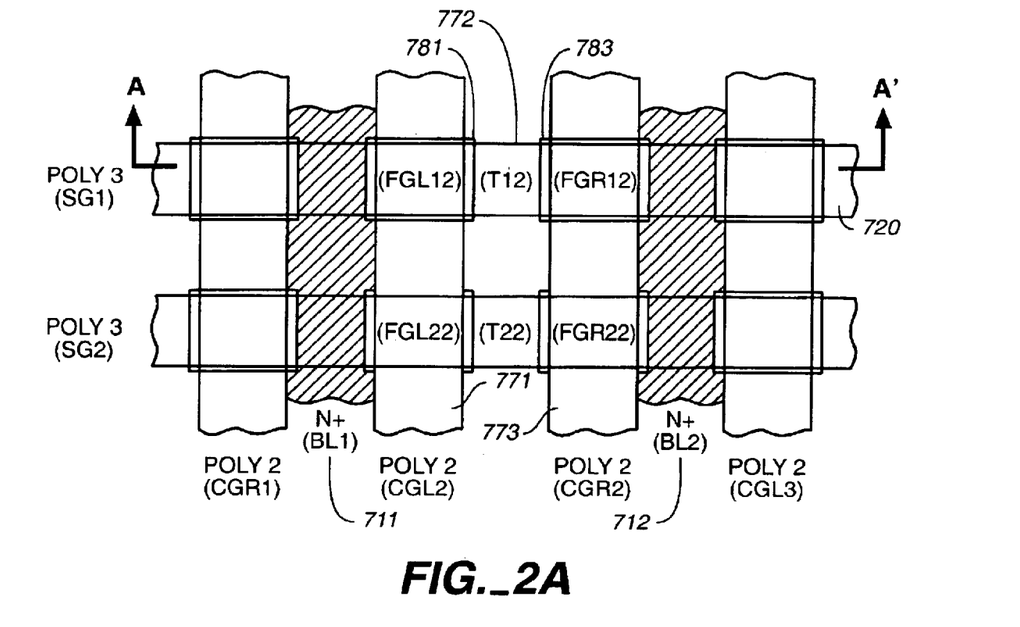
FIGS. 2a, 2b, 3a, and 3b show more detail of the memory array of the embodiment of FIG. 1.
Figure 2B:
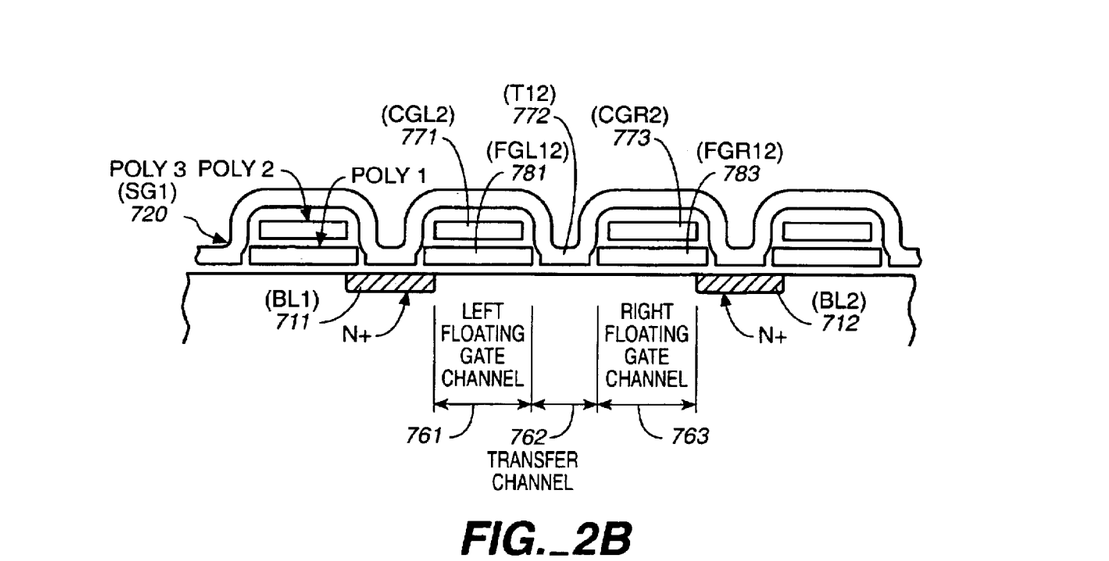

Non-volatile memories with the structure of FIG. 1 are described in U.S. Pat. Nos. 5,712,180 and 6,103,573 and U.S. patent application Ser. No. 09/505,555, filed on Feb. 17, 2000, and one entitled "Non-Volatile Memory Cell Array Having Discontinuous Drain and Source Diffusions Contacted by Continuous Bit Line Conductors and Methods of Forming" by Jack H. Yuan and Jacob Haskell, filed on Sep. 22, 2000, which are all assigned to SanDisk Corporation and which are all hereby incorporated herein by this reference. These cells can store more than four logical bits per physical floating gate storage transistor. As much of the discussion is based on the array structure and not that of the cells, other embodiments using non-volatile memories without floating gates can also be used. For example, NROM or MNOS cells, such as those described in U.S. Pat. No. 5,768,192 of Eitan and U.S. Pat. No. 4,630,086 of Sato et al. which are both hereby incorporated herein by this reference, could also be used, as could dielectric storage elements such as those described in a U.S. patent application entitled "Multi-State Non-Volatile Integrated Circuit Memory Systems That Employ Dielectric Storage Elements", by Eliyahou Harari, George Samachisa, Jack H. Yuan, and Daniel C. Guterman, filed Oct. 25, 2002, which is hereby incorporated by this reference. FIGS. 2a and 2b show top and cross-sectional views, respectively, of one embodiment of a memory cell structure with multiple floating gates and are adapted from U.S. Pat. No. 5,712,180 that was included by reference above. As shown in the cross-sectional view of FIG. 2b, a channel of the storage unit is formed between the two source/drain regions of bit-lines BL1 711 and BL2 712. The channel is subdivided into three regions: a left floating gate channel 761 under the left floating gate FGL12 781 and left control gate CGL2 771; a right floating gate channel 763 under the right floating gate FGR12 783 and right control gate CGR2 773; and, between these, a select channel 762 underneath the select transistor T12 772.

As shown in FIG. 2a, in this structure the word-lines, such as SG1 720, cross the bit-lines, such as BL1 711 and BL2 712, to form the array. The memory cell locations within the array are then defined by the intersection of these lines; for example, the cell of FIG. 2b with select transistor T12 772 lies along word-lines SG1 720 between BL1 711 and BL2 712. The control gates are connected along the columns parallel to the bit-lines instead of along the rows as in more common architectures. Thus, by applying a voltage to the control gate line CGL2 771, this voltage is applied not just to the gate of the cell containing transistor T12 772, but also the left control gates of all of the cells in the column between bit-lines BL1 711 and BL2 712.

Figure 3A:
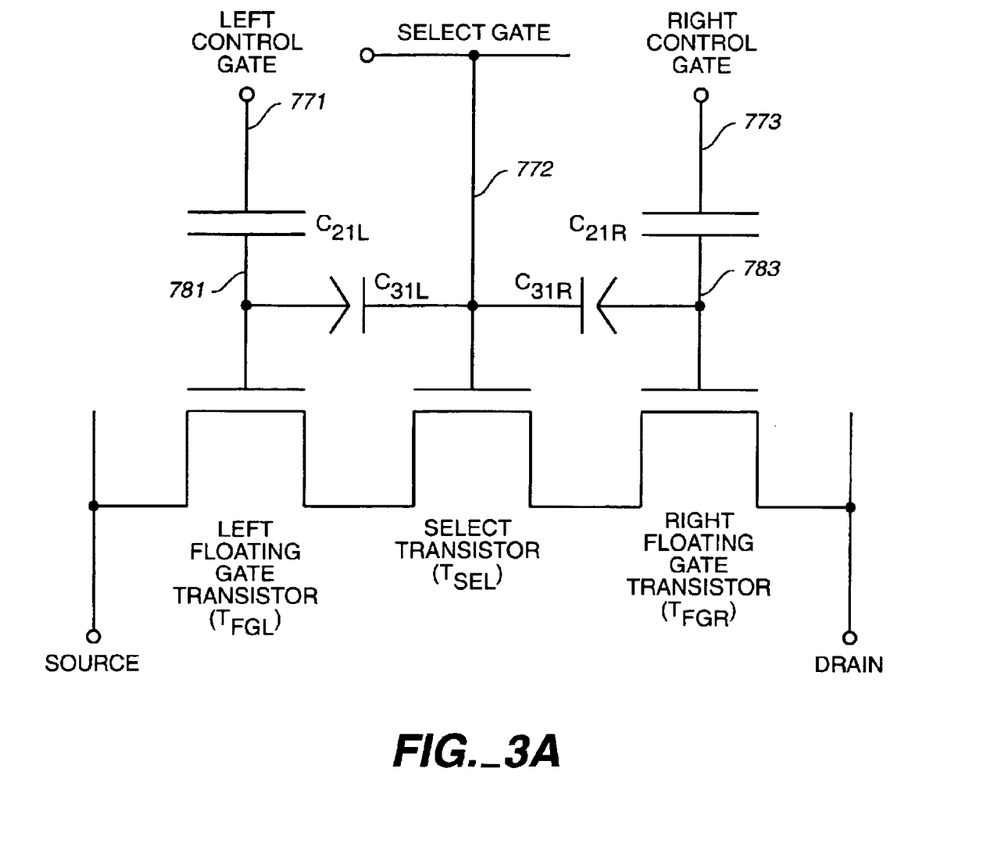
Figure 3B:
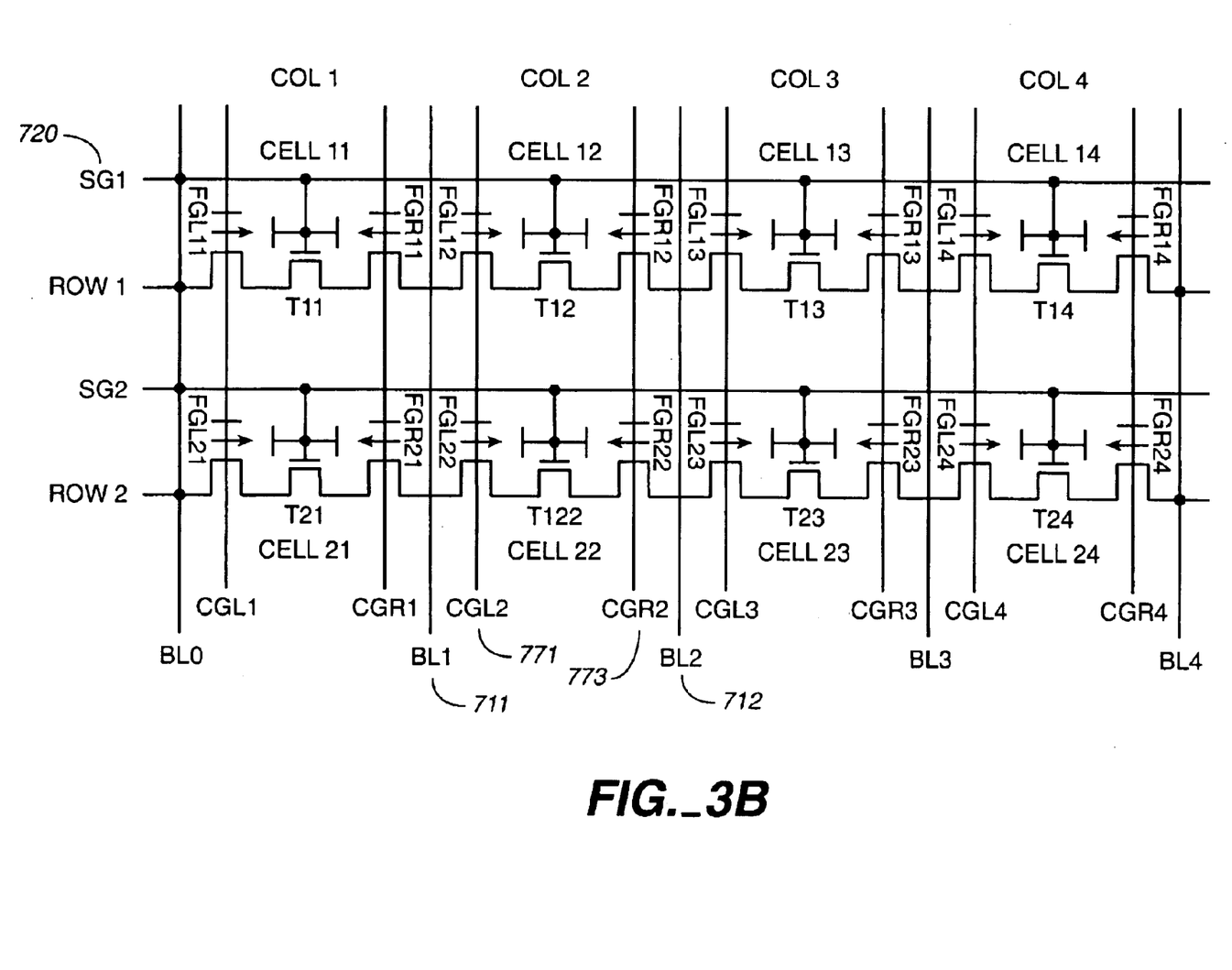

FIG. 3b is a circuit diagram depicting one embodiment of an array of memory cells such as those of FIGS. 2a and 2b, where FIG. 3a is an equivalent circuit of these memory cells. The floating gates 781 and 783 of the cell can be programmed and read independently. For example, to program the right floating gate 783 in FIG. 3a, an overdrive voltage of, for example, 8 volts is applied to the left control gate 771. The actual value is not critical, but is taken to be enough to fully turn the left floating gate transistor $T_{FGL}$ on regardless of the data state stored on its floating gate. With the left floating gate transistor $T_{FGL}$ effectively removed from the circuit, the right floating gate transistor $T_{FGR}$ can be programmed much as the transistor of a single floating gate is programmed through the source-side injection method.

In a regular programming operation, the drain is again set at around 5 volts, or more generally 4–7 volts, and the source is set at ground and/or connected to ground through a current limiting device. All of the cells in the column will be in the same condition. For the selected rows, a voltage of 1.5–5 volts is placed on the select gate, thereby turning on the select transistor. This induces a current through the channel, with the electrons entering at the source-side. In non-selected rows, the select gate line, or word-line, is held at ground and these select transistors are held turned off. The programming voltage of, say, 5–10 volts is then applied to the right control gate. These values induce a high electric field in the channel region between the select transistor and the right floating gate transistor. The result is that electrons entering from the source are injected into the (right) floating gate in response to the programming voltage. To program the left floating gate, the roles of the left and right control gates are reversed, as are the source and drain.

As shown in FIG. 1, the array can be biased so that adjoining storage units can be programmed simultaneously. For example, floating gate transistors $\alpha_0$ and $\alpha_3$ both use bit line $BL_{\alpha1}$ as a source line during programming. This allows these two transistors to either be programmed together or separately in different implementations, based on how the various lines are biased and according to speed and accuracy requirements.

The floating gate transistor can be erased by applying the erase voltage to the select gate, so that both the left and the right floating gates are erased through their respective couplings of $C_{31L}$ and $C_{31R}$, or through other methods, such as channel erase. More details on erase and other operations are given in U.S. Pat. No. 5,712,180, which was incorporated by reference above. As described there, in a sensing process for either a read or verify operation, the transistors in the storage unit not being sensed are turned fully on and the transistor whose state is being sensed can be treated by the various techniques known in the art. Channel erase is described more in previously incorporated U.S. patent application Ser. No. 09/893,277, although in the context of a NAND architecture. A number of sensing techniques are described in a U.S. patent application entitled "Noise Reduction Technique for Transistors and Small Devices Utilizing an Episodic Agitation" by Nima Mokhlesi, Daniel C. Guterman, and Geoff Gongwer filed on Jan. 18, 2002. A verify process differs from a data read process in that a verify process compares a parameter indicative of the state of the cell against a target value instead of determining which of the possible data states the cell belongs through, for example, a binary search.

Returning to the present invention, its various aspects include: 1) the massive parallel write of plurality of storage units; 2) current limiting during write for each storage unit to manage peak and average cumulative power at the possible cost of somewhat lower speed or programmability per storage unit; 3) lock out each storage unit terminating programming and storage unit current draw as each storage unit achieves its target state; 4) once the number of such storage units still programming have gone below a predetermined limit and/or the number of programming pulses has been exceeded, decrease the magnitude of the current limiting (that is, increase storage unit current) to increase programming speed/programmability. These concepts may be applied progressively as the number of storage units drops below progress target values.

In order to limit the instantaneous and the average programming current per storage unit, a constant current sink serves to limit the programming current. In the example of FIGS. 1–3, this would limit the drain to source programming current by effectively raising the source voltage. This positive source voltage will reduce the drain to source potential difference, $V_{DS}$, and increase the threshold voltage of all 3 transistors (2 floating gate, 1 select) that are in series between the source and drain of each storage unit through the body effect, thereby reducing the programming current. In doing so, it also limits the maximum achievable control or steering gate threshold voltage of the storage units. Within each programming unit (for example, a sector or programming block) there may exist a minority of cells that are harder to program. In order to have a large memory threshold window, these cells can be programmed to higher threshold voltages.

Figure 4A:
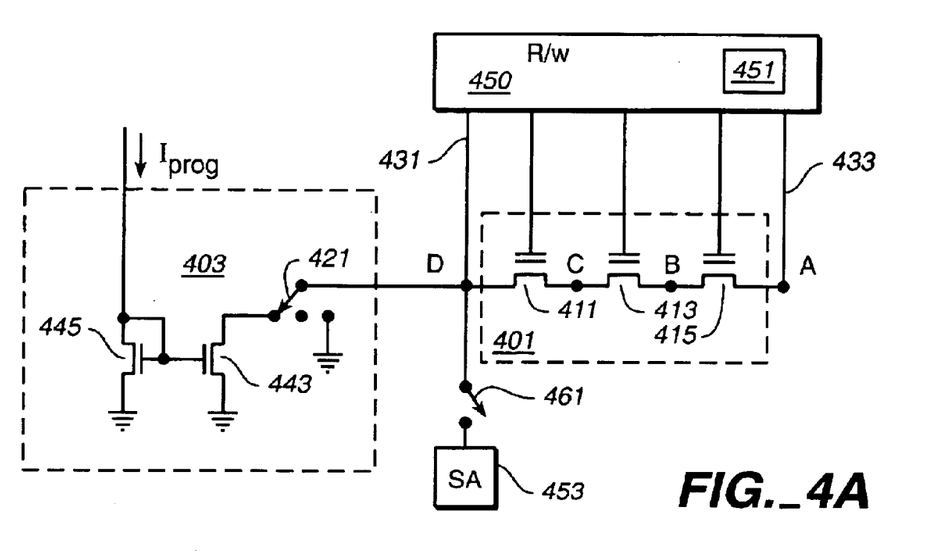
FIGS. 4a and 4b show a detail of a storage unit and current limiter of FIG. 1.

In one embodiment, dynamically lifting the constant current condition for the last few pulses applied to the last few storage units which have not yet locked out of programming after a certain number of maximum control gate programming pulses have already been applied to them may enable these hard to program storage units to program to the required higher threshold voltages. If source de-biasing is relied upon to suppers the program disturb condition, then the frequency of programming with grounded sources can be limited in order to minimize the disturb mechanism. An event counter may be devoted to monitoring the frequency of grounded source programming events. FIG. 4a shows a first exemplary embodiment of a storage unit 401 and current limiter 403 according to the embodiment of FIG. 1. In this example, a storage unit 401 is connected between bit lines 433 and 431 at nodes A and D, respectively, and is composed of floating gate transistors 411 and 415 respectively connected though nodes B and C to the interposed select transistor 413. As previously described, the storage unit 401 may alternately consist of other floating gate storage unit types, such a NAND string, or, more generally, units based on non-floating gate technologies. The exemplary storage element 401 will be used to present aspects of the invention, with the corresponding operation of these various alternatives are described in more detail in the corresponding references given above.

As drawn in FIG. 4a, the floating gate to be programmed or read is transistor 415, with the position of switches 421 and 461 shown for normal programming. When reading or verifying transistor 415, node A is the source for read which is grounded, node D is the drain for read which is driven by the sense amp, and the current limiter 403 is disconnected from node D, which means that in read/verify mode the switch 421 is in a floating position. A single pole/triple throw switch 421 is drawn in box 403. During normal programming switch 421 connects node D to the drain of transistor 443 (the position shown in FIG. 4a), during the last few programming pulses when the current limiting condition is to be lifted node D is connected to ground (the right position), and during read/verify node D is connected to a floating leg of switch 421 (represented by the center position), in effect disconnecting the current sink from Node D. A single pole/single throw switch 461, connected between the sense amp and node D, is closed during read, and is open during programming. So, during programming node D is the source for programming, the sense amp is disconnected from node D, and the current sink 403 is connected to node D.

In a typical programming process of memory cell 415 by source side injection into the floating gate of transistor 415, node A is placed at a high voltage by raising the level on bit line 433. Transistors 411 and 415 are turned on using the voltages described above on their respective control gates. Transistor 413 is turned on by applying a high enough word line (i.e. select gate) voltage to turn this select transistor on at a level that exceeds its threshold voltage by half a volt to a few volts. During programming, node D (i.e. the source for programming) is normally connected to current limiter 403, but node D is grounded when the current limiter is to be bypassed. The voltage across the whole storage unit is then $V_A - V_D$ and voltage across the channel of the transistor to be programmed, 415, is somewhat less at $V_A - V_B$ due to the drop across transistors 411 and 413. When the switch 421 connects node D to ground, the full voltage $V_A$ will be placed across the storage unit 401 (where the other voltage drops and transients found in a real circuit that will keep $V_D$ from ground are being ignored for this discussion). To program transistor 415, its control gate is pulsed with the programming voltage causing a current $I_{DS}$ to flow through its channel and charge to be stored in its floating gate. When node D is connected through switch 421 to ground, $I_{DS}$ is largely unregulated.

As described above, to control the amount current flowing in the circuit, the current limiter 403 is used. When node D is connected by switch 421 to ground through transistor 413, $I_{DS}$ is limited to be no greater than a value $I_{prog}$. When the current flow is limited, the voltage on node D is raised and the body effect will limit current flow in all three transistors, by bottle necking the current passing through the select gate 413. The two floating gate transistors 411 and 415 will be biased well above their respective thresholds during programming to present a bottle neck for current. The current limiting action of the constant current sink 403 is achieved by primarily raising the threshold voltage of the select gate transistor through the body effect. Weather current limiting is engaged or not, the select transistor is the one transistor that limits the current from node A to node D.

In the exemplary embodiment, a current mirror of NMOS transistors 443 and 445 is used. The dispositions of switches 421 and 461 are controlled by Block R/W 451. In actual implementation, switch 421 can be composed of 2 transistors: one transistor between node D and ground the gate of which is controlled by 450, and another transistor between node D and drain of 443 whose gate is also controlled by 450. Switch 461 is also a transistor between node D and the sense amp, the gate of which is also controlled by 450. When a switch is placed between 2 nodes it is the interchangeable source and drain that are connected to the two nodes. In order for contentions not to occur, the timing of turning on these transistors has to be such that one is turned off before another is turned on. Depending upon the disposition of the switch 421, the current through storage unit 401 is limited to be no greater than $I_{prog}$ or not limited. More generally, there can be several limits, $I_{prog,1} \leq I_{prog,2} \leq \ldots \leq I_{prog,n}$, available with either a connection ground or $I_{prog,n}$ representing the highest allowed flow. This allows the current flow in the storage unit to be any on of these n or n+1 values.

Storage unit 401 can correspond to any of the storage units in FIG. 1, for example that containing $\alpha_2$ and $\alpha_3$, in which case bit lines 431 and 433 would respectively correspond to $BL_{\alpha 1}$ and $BL_{\alpha 2}$ and current limit 403 would correspond to current limiter $I_{\alpha 1, lim}$ 103. Each bit line of the array is connectable to such a current limiter when it serves as a source for programming. The read, write, and corresponding control circuits and their connection to the current limiters is not shown in FIG. 1.

Figure 4B:
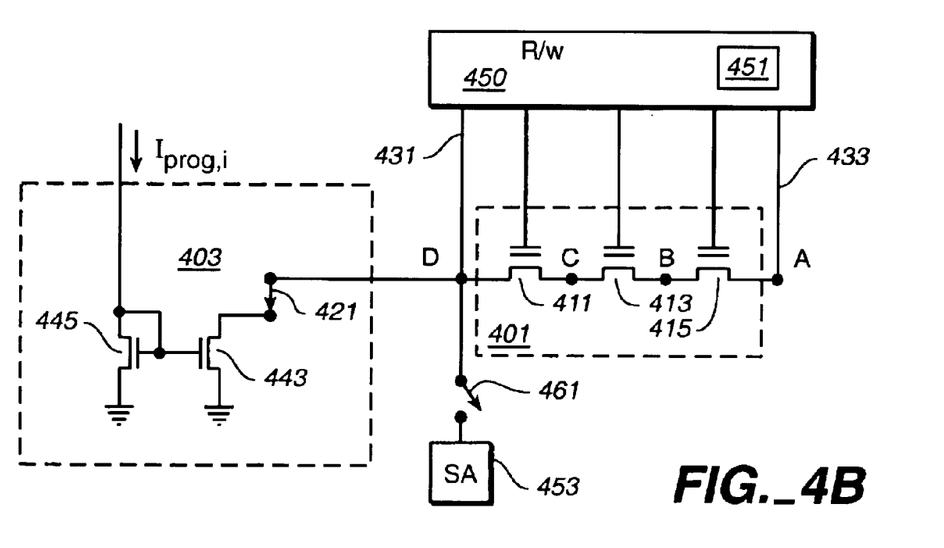

The current limiters, such as 403, may each have many legs allowing their use for multiple bit lines at the same time. Each of these may be controlled independently allowing the maximum level in each source line to be independently controlled. As noted, a large number, perhaps thousands, of storage units are programmed in parallel. This process as seen by the individual storage unit will be described with respect to FIG. 4. Normally the current mirror has a single input transistor 445 and thousands of output transistors such as 443 where each of a large number of cells that are simultaneously programmed has one output transistor. In this manner the input current of, for example, 1 $\mu$A is amortized over thousands of cells. But if each cell has its own input and output transistors, then not only does the die size increase, but also the current consumption is increased because of the cumulative effect of the 1 $\mu$A that the input transistors of the separate mirrors.

Returning to FIG. 4a, at the start of a programming process, the storage unit is biased for programming and the current level limited to $I_{prog}$ (or $I_{prog,1}$ if more than one limit is used) by limiter 403. The control gate of transistor 415 is then pulsed to store more charge leveling the floating gate of transistor 415, interspersed with sensing operations using sense amp 453 to compare the state of the storage unit against a target value. If the storage unit verifies against the target, then the storage unit can be locked out of further programming, by, for example, substantially raising the voltage level on node D. If the storage unit does not verify, the process continues. As storage units verify and are locked out, the number of storage units being programmed and the corresponding consumed programming current decreases. As the number cells still being programmed falls below a certain number, either in terms of absolute number or proportion, or after a certain number of pulses (as determined by event counter 451), or a combination of these two, the current limit on these remaining, hard to program cells can be raised. The switch 421 in the corresponding current limiters 403 can connect node D to ground. The process then continues until the programming is complete or until a storage unit is found to be unprogrammable and defective, in which case it is mapped out. If multiple limits are used, this dynamic raising of the current limits can progressively proceed through $I_{prog,1}, I_{prog,2}, \ldots, I_{prog,n}$.

FIG. 4b shows another embodiment that is a variation on that of FIG. 4a. In this case, the several current values $I_{prog,i}$, where i=1, . . . ,n with n$\geq$2 and $I_{prog,1} \leq I_{prog,2} \leq \ldots \leq I_{prog,n}$, are available to the limiting circuit 403. Node D is always connected to drain of transistor 443 during programming, and the switch 421 need only be a single pole/single throw switch. The transition from normal programming with constant current sinking to a grounded node D can be made a more gradual one by incrementally increasing the mirror input current labeled $I_{prog,i}$ which is fed to the drain node of transistor 445. For example $I_{prog,1}$ could be set to 1 $\mu$A for as long as the control gate voltage is being stair cased from pulse to pulse. But when the programming control gate voltage reaches its maximum value of, for example 12V, and if there still remain a few cells that have not been sufficiently programmed, then the subsequent programming pulse can be at the same maximum control gate voltage, but the current limiting can be relaxed from $I_{prog,1}$=1 $\mu$A per cell to $I_{prog,2}$=2 $\mu$A per cell and with the next pulse can be applied with a current sink value of, for example, $I_{prog,3}$=4 $\mu$A per cell. This provides a more gradual transition than completely lifting the current limiting all at once. An advantage of the gradual method is a smaller likelihood of over programming upon the first application of a non-current limited programming pulse. The gradual transition method of FIG. 4b is more easily implemented in an architecture using commonly driven control gates (as opposed to an independently driven control gate architecture) because all the cells that are simultaneously being programmed reach the maximum control gate condition at the same time, which is not the case for the independently driven control gate architecture.

In FIGS. 4a and 4b, switches 421 and 461 can be controlled by the controller or by internal peripheral circuits on the memory chip, such as those represented schematically by blocks 451 and 453. For high speed operations, it is usually preferable that the controller should never become aware of the existence of hard to program cells, let alone try to program them. In this way, the controller just needs to shift in data that is to be programmed, the address that the data should go to, and a command to the memory chip to start programming, with all subsequent activities transparent to the controller. The memory chip's internal peripheral circuits are on their own until the programming is done and when the programming is finished the memory chip communicates to the controller that programming is finished by changing the state of the Ready/Busy signal.

Figure 5:
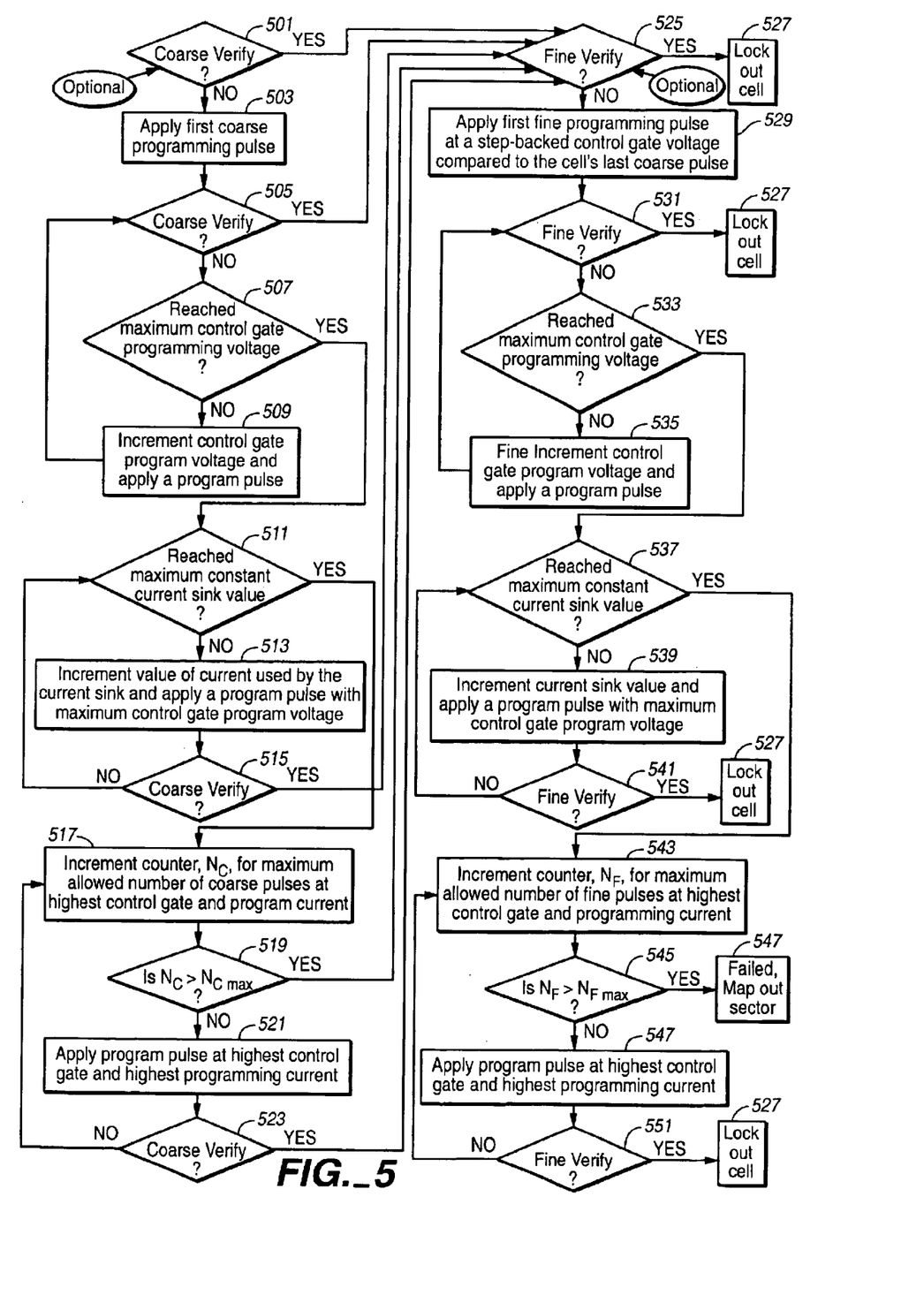
FIG. 5 is a flowchart of the operation of one embodiment of the present invention.

FIG. 5 is a flow chart for an exemplary embodiment of the present invention, in this case using a coarse-fine programming technique on a memory with storage elements of the type shown in FIGS. 1–4. The use of a programming technique having a coarse mode and a fine mode is described in U.S. patent application Ser. No. 09/793,370 filed Feb. 26, 2001, which is hereby incorporated by reference.

The process begins at optional step 501 with verifying in parallel all cells that belong to a programming block against their individual coarse target thresholds. In the commonly driven steering architecture this verify and subsequent verifies will have to be broken down to a sequence of sub-verifies, each of which is verifying a group of cells against their the same target state. When all the steering gates of group of cells that belong to the same programming block are tied to one another, there is no way to apply, for example, 1 volt to some of them that are targeted to be programmed to state 2 while at the same time 2 volts is being applied to some others that are being programmed to state 4. So after each programming pulse, all or at least a subset of the sub-verifies have to be performed. In a 8 state per cell design, each programming pulse will have to be followed by 7 verify operations, the first of which discriminates between states 0 and 1, the second of which discriminates between states 1 and 2, . . . , and the seventh of which discriminates between states 6 and 7. Suitable program verification techniques are described further in U.S. patent application Ser. No. 10/314,055, filed Dec. 5, 2002, which is hereby incorporated by reference. A parameter value indicative of the state of the cell, typically a current or voltage, is compared against its target value, such as is described in the U.S. patent application entitled "Noise Reduction Technique for Transistors and Small Devices Utilizing an Episodic Agitation" incorporated by reference above. If the block has been previously programmed, this will have been preceded by an erase process and, depending on the embodiment, the erase process is followed by a soft programming process as described further below. If the storage units verify to their coarse reference value, the process switches to the fine mode of step 525; if not, the process goes to step 503.

The storage units needing programming are biased, for example by placing a voltage across the source and drain of a floating gate transistor cell, the current is limited to a first level, and the programming, such as pulsing the control gate of a floating gate cell, occurs in step 505. This is followed by another coarse verify (505), again going to step 525 if the target criteria are met. If the cell does not verify, the programming voltage at the control gate is increased and another pulse is applied (509), followed by a return to the verify step 505. Between steps 505 and 509, step 507 checks whether maximum control gate programming voltage is reached. The loop of steps 505, 507, and 509 continues until either verified, in which case the process goes to step 525, or the maximum control gate programming voltage is reached, in which case it goes to step 511.

Steps 511, 513, and 515 form a loop where the current limit is raised while the control gate program voltage is kept at its maximum value. In alternate embodiments, the voltage could be backed down and raised back to its maximum in steps, as in the loop of steps 505–509, more than one pulse at a given current limit/maximum voltage combination could be used, or a combination of these. In steps 511, the value of the current sink is first checked, followed by being incremented in step 513 if a higher value is available, and another coarse verify in step 515. If the maximum current sink value is reached in step 511, the process goes to step 517.

Steps 517, 519, 521, and 523 allow for the storage element to be pulsed a number of times ($N_{Cmax}$) at the maximum control gate programming voltage and highest programming current. In step 517, the number of such pulses, $N_C$, is incremented, followed by a check (519) on whether it has exceeded its maximum value $N_{Cmax}$ and the application of a pulse if not (521). If the cell verifies or the maximum number of pulses at these conditions is reached, the process goes to step 525.

Step 525 is an initial verify at the fine target parameter value and is optional. If the cell does not verify, the control gate voltage is stepped back and the fine programming process begins at step 529. Steps 531–551 are the same as the corresponding steps in the coarse programming phase. However, if a cell verifies at any of the fine verify steps (steps 525, 531, 541, and 551), it is now locked out in step 527. Also, if the maximum number of pulses ($N_F$) at the maximum control gate programming voltage and highest programming current exceeds the limit ($N_{Fmax}$) in step 545, programming has failed and the corresponding cell or the entire sector that the cell belongs to is mapped out in step 547.

Various aspects of the present invention can be applied to soft programming, which is otherwise known as erase recovery. By definition, FLASH-cell erasure requires the erase of at least an entire sector, which is usually a word-line, of cells. Due to differences in erase rates of the various cells on this common word-line, cells may often erase beyond the minimum lower threshold voltage needed to reliably indicate an erased state. Soft programming is a technique used to gently raise the thresholds of over-erased cells prior to the actual data programming. More details on some of these techniques can be found in U.S. Pat. Nos. 5,172,338 and 5,272,669, both of which are assigned to SanDisk Corporation and both of which are hereby incorporated herein by this reference. Aspects of soft programming particularly applicable to the exemplary embodiment of FIGS. 1–4 are presented in U.S. patent application Ser. No. 09/865,320 filed on May 25, 2001, which is incorporated herein by reference above.

In a memory array there may exist defective cells that have already been mapped out of the logical sector and are hard to soft program under source debiasing conditions with the current limiting engaged. If such cells exist in the array in an over-erased state, they will not be programmed with data. As they are over-erased, they can result in a parasitic current path. If these cells are hard to program, a standard soft programming operation with the current limited at its lowest level may not be sufficient to take them out of their over-erased condition. To raise the threshold sufficiently on these cells, the present invention can be applied to the soft programming process. These memory cells may be soft programmed with a grounded source, so as to eliminate parasitic current paths that introduce read errors when a deselected over erased memory cell (that is intended to be off) actually conducts. As with the other implementations of the present invention, one or more intermediate current limit(s) between the first limit and a grounded source can be used.

Although the various aspects of the present invention have been described with respect to specific exemplary embodiments, it will be understood that the invention is entitled to protection within the full scope of the appended claims.

What is claimed is:

1. A method of programming a non-volatile memory array comprising:

simultaneously applying a first set of programming voltage waveforms to the terminals of a plurality of memory storage units, wherein the current flowing between a first and a second of the terminals of each of the plurality of storage units is limited to be not greater than a first current level; and subsequent to said applying a first set of programming voltage waveforms, simultaneously applying a second set of programming voltage waveforms to the terminals of a first subset of the plurality memory storage units, wherein the current flowing between the first and the second of the terminals of each of the first subset is not limited to be not greater than the first current level.

2. The method of claim 1, wherein during said applying a second set of programming voltage waveforms to the terminals of a first subset of the plurality memory storage units, the current flowing between the first and the second of each of the terminals of the first subset is limited to be below a second current level that is greater than the first current level.

3. The method of claim 1, wherein each of said memory storage units comprises a floating gate transistor and wherein the current flowing between the first and the second of the terminals is the drain-source current.

4. The method of claim 3, wherein each of said memory storage units comprises one or more floating gate transistors and one or more select transistors.

5. The method of claim 3, wherein said first set of programming voltage waveforms comprises applying at least one programming pulse to the control gate of each of the plurality of memory storage units in parallel and said second set of programming voltage waveforms comprises applying at least one programming pulse to the control gate of each of the first subset of the plurality of memory storage units in parallel.

6. The method of claim 5, wherein said first set of programming voltage waveforms comprises applying a first predetermined number of programming pulses to the control gate of each of the plurality memory storage units.

7. The method of claim 6, wherein said second set of programming voltage waveforms comprises applying a second predetermined number of programming pulses to the control gate of each of the first subset of the plurality memory storage units.

8. The method of claim 1, wherein each of said memory storage units is capable of storing more than one bit of data.

9. The method of claim 1, further comprising:
subsequent to said applying a first set of programming voltage waveforms, measuring a parameter value related to the data content of each of the plurality of the memory storage units; and
determining the first subset based on the measured values for the parameter.

10. The method of claim 9, further comprising:
locking out those of the plurality memory storage units not in the first subset prior to said applying a second set of programming voltage waveforms.

11. The method of claim 9, wherein said determining the first subset comprises:
determining that a predetermined portion of said plurality memory storage units have achieved a predetermined value of said parameter value; and
forming the first subset from the memory storage units that have not achieved said predetermined value.

12. The method of claim 9, wherein said applying a first set of programming voltage waveforms, said applying a second set of programming voltage waveforms, and said determining the first subset is performed as part of a coarse programming mode, the method further comprising subsequent to the coarse programming mode:
simultaneously applying a third set of programming voltage waveforms to the terminals of a second subset of the plurality memory storage units, wherein the current flowing between the first and the second of the terminals of each of the plurality of storage units is limited to be below the first current level; subsequent to said applying a third set of programming voltage waveforms, measuring the parameter value related to the data content of each of the second subset of the memory storage units;
determining a third subset based on the values for the parameter measured subsequent to said applying a third set of programming voltage waveforms; and
simultaneously applying a fourth set of programming voltage waveforms to the terminals of the third subset of the plurality of memory storage units, wherein the current flowing between the first and the second of the terminals of each of the third subset is not limited to be below the first current level, and wherein said applying a third set of programming voltage waveforms, said applying a fourth set of programming voltage waveforms and said determining the second subset is performed as part of a fine programming mode.

13. The method of claim 1, wherein said first and second sets of programming voltage waveforms are applied in a soft programming process.

14. A non-volatile memory comprising:
a plurality of memory storage units;
a current limiting circuit connectable to the memory storage units whereby the amount of a current flowing through a connected storage unit can be controlled; and
programming cicuitry connected to the storage units and the current limiting circuit, whereby during an operation simultaneously programming one or more of said plurality of storage units, the respective current flowing in each of said one or more storage units can be limited to be not greater than a first current level in a first mode and allowed to exceed the first current level in a second mode.

15. The non-volatile memory of claim 14, wherein in the second mode the respective current flowing in each of said one or more storage units can be limited to be below a second current level that is greater than the first current level.

16. The non-volatile memory of claim 14, wherein each of said memory storage units comprises a floating gate transistor and wherein the current flowing is the drain-source current.

17. The non-volatile memory of claim 16, wherein each of said memory storage units comprises one or more floating gate transistors and one or more select transistors.

18. The non-volatile memory of claim 16, wherein during a programming process the programming cicuitry applies a set of programming voltage waveforms comprising applying at least one programming pulse to the control gate of each of the plurality memory storage units.

19. The non-volatile memory of claim 14, wherein each of said memory storage units is capable of storing more than one bit of data.

20. The non-volatile memory of claim 14, wherein said current limiter is formed using a current mirror.

21. The non-volatile memory of claim 14, further comprising:
sensing circuitry coupled to the programming circuitry and connectable to the storage units whereby a parameter value related to the data content of each of the plurality of the memory storage units can be sensed in a verify process, whereby storage units that verify in the verify process can be locked out of the operation of simultaneously programming a plurality of storage units.

22. The non-volatile memory of claim 14, further comprising:
an event counter coupled to the programming circuitry, whereby the current limiter is controlled in response to said event counter.

23. The non-volatile memory of claim 22, wherein the programming cicuitry applies a series of voltage pulses to the storage units to which it is connected and the event counter counts the number of the pulses.

* * * * *